United States Patent [19]
Yamazaki et al.

[11] Patent Number: 5,259,548
[45] Date of Patent: Nov. 9, 1993

[54] WIRE BONDING METHOD

[75] Inventors: Nobuto Yamazaki; Kazuo Sugiura; Minoru Torihata; Kuniyuki Takahashi; Tatsunari Mii, all of Tokyo, Japan

[73] Assignee: Kabushiki Kaisha Shinkawa, Tokyo, Japan

[21] Appl. No.: 901,418

[22] Filed: Jun. 19, 1992

[30] Foreign Application Priority Data

Jun. 19, 1991 [JP] Japan .................................. 3-173397

[51] Int. Cl.⁵ .............................................. H01L 20/60
[52] U.S. Cl. ................................................... 228/180.5
[58] Field of Search .................................. 445/4.5, 179

[56] References Cited

FOREIGN PATENT DOCUMENTS

| 57-87143 | 5/1982 | Japan . |
| 19341 | 1/1984 | Japan .................................. 228/4.5 |
| 1-26531 | 5/1989 | Japan . |

*Primary Examiner*—Kenneth J. Ramsey
*Attorney, Agent, or Firm*—Koda and Androlia

[57] ABSTRACT

In order to avoid an excessive wire loop curvature at a second bonding point, a wire bonding is performed with the steps of: moving the capillary, after the wire is connected to a first bonding point, toward the second bonding point, and right before the capillary comes above the second bonding point, the capillary is moved down obliquely so that the capillary is positioned exactly above the second bonding point, and then the capillary is moved down straight so that the wire is pressed against the second bonding point.

2 Claims, 3 Drawing Sheets

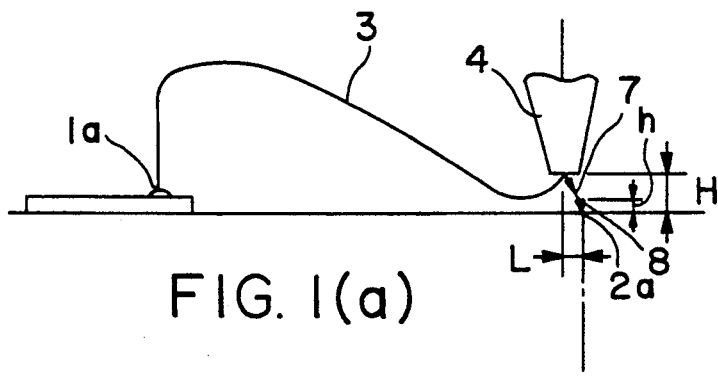
FIG. 1(a)
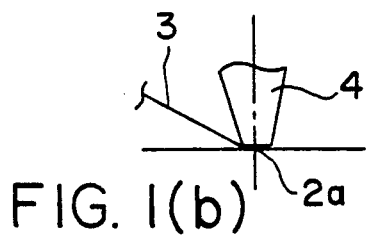
FIG. 1(b)
FIG. 2
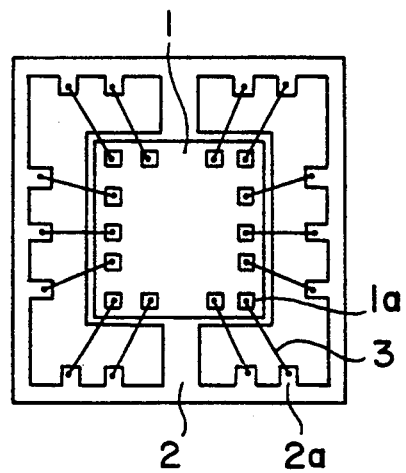

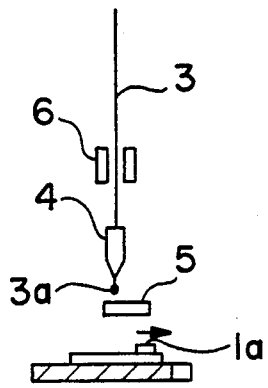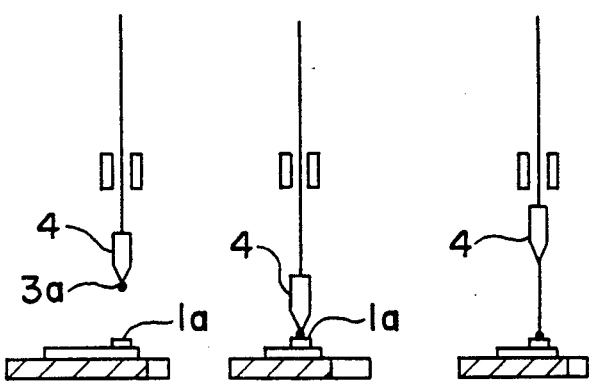
FIG. 3(a) FIG. 3(c)
FIG. 3(b) FIG. 3(d)
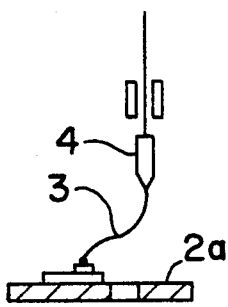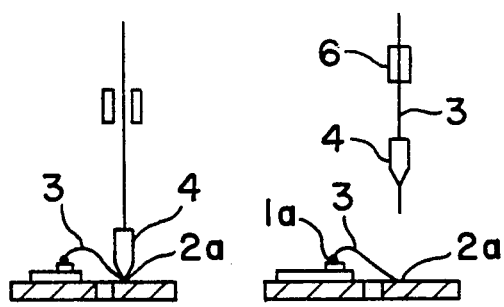
FIG. 3(e) FIG. 3(g)
FIG. 3(f)

WIRE BONDING METHOD

BACKGROUND OF THE INVENTION

1 Field of the Invention

The present invention relates to a wire-bonding method for bonding the first and second bonding points of a workpiece and more particularly to a method for reducing a wire loop curvature.

2. Prior Art

A wire-bonding is one of the processes for manufacturing an integrated circuit.

As shown in FIG. 2, a wire 3 is connected between a pad 1a (a first bonding point) of a pellet 1 and a lead 2a (a second bonding point) of a lead frame 2 by wire-bonding.

Several wire-bonding methods have been developed and proposed, and one of the most general methods of wire-bonding will be described below with reference to FIGS. 3(a) through 3(g).

First, as shown in FIG. 3(a), a ball 3a is formed at a tip end of a wire 3 extended through a capillary 4 by a spark discharging from an electric torch 5, and the electric torch 5 is moved in the direction indicated by an arrow after the spark discharge.

Next, as shown in FIGS. 3(b) and (c), the capillary 4 is moved and located above a first bonding point 1a, then the capillary 4 is moved downwardly, and the ball 3a is connected to the first bonding point 1a.

After the ball 3a is connected to the first bonding point 1a, the wire 3 is fed out of the tip end of the capillary 4 while the capillary 4 is moved upwardly as shown in FIG. 3(d), and the capillary 4 is located above a second bonding point 2a as shown in FIG. 3(e).

Afterwards, the capillary 4 is moved toward the second bonding point 2a, and the wire 3 is fastened thereto as shown in FIG. 3(f). After the wire 3 is connected to the second bonding point 2a, the capillary 4 is moved toward and located at a prescribed position. A clamp 6 is closed to hold the wire 3, and the wire 3 is cut when the capillary 4 and the clamp 6 are moved upwardly as shown in FIG. 3(g). As a result, the wire 3 is bonded between the first and second bonding points. One process of the wire-bonding is thus completed.

Wire-bonding methods of this kind are described in, for example, the Japanese Patent Application Laid-Open No. 57-87143 and the Japanese Patent Application Publication No. 1-26531.

However, in recent years, gaps between the adjacent wires needs to be narrower in view of downsizing of an integrated circuit. As a result, there is a probability of a short circuit between the wires 3, so that an allowance of a wire loop curvature becomes severe.

FIG. 4 is a plan view of the first and second bonding points 1a and 2a. A straight line 3 which extends between the first bonding point 1a and the second bonding point 2a is an intended line of a wire. In the specification, a "wire loop curvature" means that a wire is bent and not in accord with the line 3, for example, as shown by a line 3'.

In the wire-bonding method described above, when the capillary 4 is positioned above the second bonding point 2a at which a distance between the surface of the second bonding point and the lower end of the capillary 4 is very short, the wire 3 is supplied as shown in FIG. 5(a). In this condition, the capillary 4 is moved downwardly to connect the wire 3 onto the second wire bonding point 2a as shown in FIG. 5(b). Therefore, an excessive wire, which is a part of the wire 3 having the length "C", may cause the wire 3 to be curved when the capillary 4 is pressed against the second bonding point.

If the excessive wire C causes the wire 3 to push upwardly, there is no problem. However, when the capillary 4 is pressed against the second bonding point, if the lower portion 3b of the excessive wire comes into contact with the lead frame 2 and the excessive wire urges the wire to move toward the first bonding point 1a, the wire 3 is yielded as shown by the line 3' in FIG. 4.

SUMMARY OF THE INVENTION

Accordingly, the object of the present invention is to provide a wire bonding method that can prevent a wire loop curvature.

The object of the present invention is accomplished by a unique method which includes: (a) after a wire is connected to a first bonding point, a capillary is moved toward a second bonding point until the capillary is located above and right before the second bonding point, (b) then the capillary is moved down obliquely until the capillary is positioned exactly above the second bonding point so that the distance between the upper surface of the second bonding point and the lower end of the capillary is very short, (c) and then the capillary is moved down vertically so that the wire is pressed against the second bonding point.

In this bonding method, after the capillary is moved to be very close to the second bonding point, the capillary is moved down obliquely. Accordingly, excessive wire is not fed out of the capillary. In other words, the wire which is supplied out from the capillary can have an exact length necessary for connecting the first and second bonding points. Therefore, the wire is not yielded by an excessive wire and the curvature of the wire is prevented.

BRIEF DESCRIPTION OF THE DRAWINGS

FIG. 1(a) shows a capillary positioned above a second bonding point in the wire bonding process of the present invention;

FIG. 1(b) shows a capillary pressed against the second bonding point according to the wire bonding process of the present invention;

FIG. 2 is a plan view of a bonded integrated circuit;

FIGS. 3(a) through 3(g) show a general wire bonding process;

DETAILED DESCRIPTION OF THE INVENTION

Figure 4:
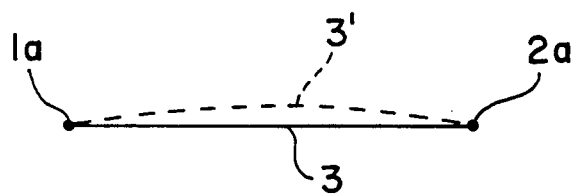
FIG. 4 is a plan view of a first and second bonding points connected with a wire.
Figure 5A:
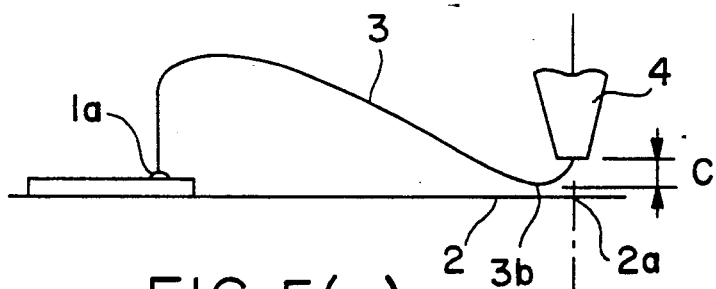
FIG. 5(a) shows a capillary pressed against a second bonding point according to a prior art wire bonding method.
Figure 5B:
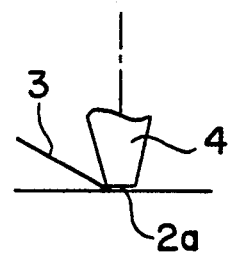
FIG. 5(b) shows a capillary pressed against the second bonding point according to the prior art wire bonding method.

One embodiment of the present invention will be described with reference to FIG. 1.

The essential feature of the present invention is a movement of a capillary 4 that is occurred immediately before a wire is bonded to a second bonding point. Therefore, a detailed explanation of the capillary 4 moved from the first bonding point to the second bonding point is omitted. In other words, the capillary 4 can be moved in any way from the first bonding point to above the second bonding point.

As shown in FIG. 1, after one end of a wire 3 is connected to a first bonding point 1a, the capillary 4 is moved toward a second bonding point 2a and is located above the second bonding point 2a, leaving a gap H between the lower end of the capillary and the surface of the second bonding point.

At this time, the capillary 4 is not located exactly above the second bonding point. More specifically, the capillary 4 is positioned above and right before the second bonding point 2a, leaving a horizontal gap L between the second bonding point 2a and the point where the wire 3 is extended through the capillary 4.

After being positioned at the predetermined location, the capillary 4 is moved down obliquely in the direction indicated by arrow 7 so that the capillary 4 is positioned exactly above the second bonding point 2a and a vertical gap between the lower end of the capillary 4 and the surface of the second bonding point is "h".

Consecutively, the capillary 4 is further moved downwardly in the direction indicated by an arrow 8, and the wire 3 is pushed upon and connected to the second bonding point 2a as shown in FIG. 1(b).

As described above, an excessive wire which is beneath the capillary 4 is used as a part of the wire 3 by the capillary 4 which is moved down obliquely. Therefore, an excessive wire is not fed out of the capillary 4 and the wire 3 is not pushed toward the first bonding point when the capillary 4 comes into contact with the second bonding point 2a. As a result, the wire loop curvature which would cause a short circuit is prevented.

The numerical values of the gaps H and L are changed subject to the conditions of the wire bonding process such as the diameter of a wire, material of the wire, and a transverse speed of the capillary. Several tests indicate that satisfactory conditions are $H = 100-500$ $\mu$m, $L = 25-100$ $\mu$m, and $h = 30-100$ $\mu$m.

As described above, after the capillary is positioned above and right before the second bonding point, the capillary is moved down obliquely. Accordingly, an excessive wire is not fed under the capillary, the wire is not yielded by the excessive wire, and the wire loop curvature is prevented.

We claim:

1. A wire bonding method for connecting first and second bonding points comprising the steps of:

moving a capillary, after a wire is connected to a first bonding point, toward a second bonding point to a first position located above and right before said second bonding point, said first position being located a first predetermined height (H) above said second bonding point and at a first predetermined distance (L) before said second bonding point;

moving said capillary obliquely downwardly from said first position to a second position exactly above said second bonding point; and moving said capillary down vertically from said second position so that said wire is pressed against said second bonding point.

2. A wire bonding method according to claim 1 wherein said second position is located at a second predetermined height (h) above said second bonding point and said first predetermined height (H) is larger than said second predetermined height (h).

* * * * *